(12) United States Patent
Buch et al.

(10) Patent No.: US 11,315,890 B2
(45) Date of Patent: Apr. 26, 2022

(54) METHODS OF FORMING MICROVIAS WITH REDUCED DIAMETER

(71) Applicant: Applied Materials, Inc., Santa Clara, CA (US)

(72) Inventors: Chintan Buch, Santa Clara, CA (US); Roman Gouk, San Jose, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/006,277

(22) Filed: Aug. 28, 2020

(65) Prior Publication Data

US 2022/0051999 A1    Feb. 17, 2022

Related U.S. Application Data

(60) Provisional application No. 63/064,400, filed on Aug. 11, 2020.

(51) Int. Cl.
  *H01L 23/00*  (2006.01)

(52) U.S. Cl.
  CPC .............. *H01L 24/03* (2013.01); *H01L 24/05* (2013.01); *H01L 2224/024* (2013.01); *H01L 2224/0239* (2013.01); *H01L 2224/02311* (2013.01); *H01L 2224/02313* (2013.01); *H01L 2224/02331* (2013.01); *H01L 2224/02333* (2013.01); *H01L 2224/02381* (2013.01); *H01L 2224/0557* (2013.01); *H01L 2224/05569* (2013.01)

(58) Field of Classification Search
  CPC ..................... H01L 24/03; H01L 24/05; H01L 2224/02381; H01L 2224/0239; H01L 2224/0557; H01L 2224/024; H01L 2224/02311; H01L 2224/02331; H01L 2224/02333; H01L 2224/05569; H01L 2224/02313
  See application file for complete search history.

(56) References Cited

U.S. PATENT DOCUMENTS

| 10,727,083 | B1 | 7/2020 | Gouk et al. |
| 10,937,726 | B1 | 3/2021 | Chen et al. |
| 2009/0000813 | A1* | 1/2009 | Hsu .................. H05K 1/116 174/262 |
| 2012/0302054 | A1 | 11/2012 | Johnson |
| 2015/0348895 | A1* | 12/2015 | Sen .................. H01L 23/3107 257/774 |
| 2016/0081187 | A1 | 3/2016 | Mori et al. |

(Continued)

FOREIGN PATENT DOCUMENTS

KR    20100122413 A    11/2010

OTHER PUBLICATIONS

PCT International Search Report and Written Opinion in PCT/US2021/044944 dated Nov. 30, 2021, 9 pages.

*Primary Examiner* — Mamadou L Diallo
(74) *Attorney, Agent, or Firm* — Servilla Whitney LLC (57) ABSTRACT

A method for forming microvias for packaging applications is disclosed. A sacrificial photosensitive material is developed to form microvias with reduced diameter and improved placement accuracy. The microvias are filled with a conductive material and the surrounding dielectric is removed and replaced with an RDL polymer layer.

19 Claims, 6 Drawing Sheets

(56) References Cited

U.S. PATENT DOCUMENTS

| | | | |
|---|---|---|---|
| 2016/0190007 A1* | 6/2016 | Wang | H01L 21/76883 |
| | | | 205/123 |
| 2017/0005058 A1* | 1/2017 | Hurwitz | H01L 23/3135 |
| 2018/0190604 A1* | 7/2018 | Oka | H01L 24/19 |
| 2018/0308792 A1* | 10/2018 | Raghunathan | H01L 23/49866 |
| 2019/0206823 A1 | 7/2019 | Darmawikarta et al. | |
| 2019/0259631 A1* | 8/2019 | May | H01L 23/49866 |
| 2019/0287934 A1* | 9/2019 | Deng | H01L 21/4867 |
| 2020/0068711 A1* | 2/2020 | Wolter | H05K 3/3485 |
| 2020/0075484 A1* | 3/2020 | Yuferev | H01L 21/76877 |
| 2020/0159113 A1 | 5/2020 | Gouk et al. | |
| 2020/0221578 A1 | 7/2020 | Chung et al. | |
| 2020/0275552 A1* | 8/2020 | Wu | H01L 23/49822 |
| 2020/0312713 A1* | 10/2020 | Hichri | H01L 21/76808 |
| 2020/0357749 A1 | 11/2020 | Chen et al. | |
| 2020/0395280 A1* | 12/2020 | Chen | H01L 23/3128 |
| 2021/0125967 A1* | 4/2021 | Zhai | H01L 21/56 |
| 2021/0159158 A1 | 5/2021 | Chen et al. | |
| 2021/0159160 A1 | 5/2021 | Chen et al. | |
| 2021/0234060 A1 | 7/2021 | Chen et al. | |

\* cited by examiner

METHODS OF FORMING MICROVIAS WITH REDUCED DIAMETER

CROSS-REFERENCE TO RELATED APPLICATIONS

This application claims priority to U.S. Provisional Application No. 63/064,400, filed Aug. 11, 2020, the entire disclosure of which is hereby incorporated by reference herein.

TECHNICAL FIELD

Embodiments of the disclosure generally relate to methods for forming microvias with reduced diameter and/or increased alignment. In particular, embodiment of disclosure relate to methods of forming copper pillars in redistribution layer (RDL) polymer dielectrics.

BACKGROUND

RDL polymer dielectrics are used to redistribute high density I/Os emanating from chips onto the package substrate. Multilayer RDLs are used to interconnect two or more chips. Using a semi-additive process (SAP), copper traces are fabricated in planar 2D fashion. Successive layers are vertically interconnected by means of microvias.

While lines have continued to scale down in width and spacing to <20 μm, microvia scaling is currently one of the biggest bottleneck that the industry faces. Scaling down of copper lines without shrinking via diameters inhibits wiring density per layer, thereby increasing layer count and package fabrication cost.

Industry standard dielectrics usually have silica fillers filled in epoxy dielectric. Such composite materials are typically used for their thermomechanical and electrical performance. While these smooth-surface composite dielectrics enable fabrication of fine lines, forming small vias using any subtractive processing like etch/laser is a significant challenge due to the potential non-homogeneity of the bulk material.

Microvias are typically formed by laser drilling. However, laser drilled microvia diameter is limited to 20 μm diameter in production. Mainly for cost and throughput reasons, laser drilled vias are difficult to scale below the 20 μm node.

Accordingly, there is a need for new methods of forming microvias, particularly microvias with reduced diameter and increased placement accuracy.

SUMMARY

One or more embodiments of the disclosure are directed to a method of forming a microvia. The method comprises depositing a conductive seed layer on a substrate. A first dielectric layer is deposited. The first dielectric layer is patterned to form at least one via having a diameter. A conductive material is deposited into the at least one via to form at least one conductive pillar with a height. The first dielectric layer and the conductive seed layer are removed from the substrate. A second dielectric layer is deposited around the at least one conductive pillar.

Additional embodiments of the disclosure are directed to a method of forming a microvia. The method comprises depositing a copper seed layer on a substrate. A first copper layer is deposited on the copper seed layer. The first copper layer is patterned to form a first copper line. A first dielectric layer is deposited on the first copper line. The first dielectric layer being photosensitive. The first dielectric layer is patterned to form a via having a diameter. The via positioned over the first copper line. A copper material is deposited into the via to form a copper pillar. The first dielectric layer and the copper seed layer are removed from the substrate. A second dielectric layer is deposited around and over the copper pillar. The second dielectric layer comprising silica filled epoxy. The second dielectric layer is planarized to expose the top of the copper pillar. A second copper layer is deposited on the second dielectric layer and the copper pillar. The second copper layer is patterned to form a second copper line.

Further embodiments of the disclosure are directed to a non-transitory computer readable medium including instructions, that, when executed by a controller of a processing system, cause the processing system to perform operations of: depositing a copper seed layer on a substrate; depositing a first dielectric layer; patterning the first dielectric layer to form a via having a diameter; depositing a copper material into the via to form a copper pillar; etching the first dielectric layer and the copper seed layer from the substrate; and depositing a second dielectric layer around the at least one conductive pillar.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to a method for forming a microvia. Some embodiments of this disclosure provide microvias with reduced diameter relative to known processes. Some embodiments of this disclosure provide microvias with improved placement accuracy.

Some embodiments of this disclosure advantageously provide microvias with reduced diameter. In some embodiments, the diameter of the microvia is less than or equal to 20 μm, less than or equal to 10 μm, or less than or equal to 5 μm. In some embodiments, the diameter of the microvia is greater than or equal to 0.05 μm, 0.1 μm, 0.2 μm, 0.5 μm, 1 μm or 2 μm. Without being bound by theory, the smaller diameters allow for higher wiring density in RDL (IO/mm/layer) without the need for an increased RDL count.

Some embodiments of this disclosure advantageously utilize equipment and/or processes which are well known in the art. Examples include, but are not limited to: physical vapor deposition (PVD), lithography, copper electrochemical deposition (ECD), and etch/chemical-mechanical planarization (CMP). Without being bound by theory, it is believed that the use of known equipment and processes reduces resistance to adoption and increases the potential uses of existing hardware.

Some embodiments of this disclosure advantageously provide microvias with increased overlay accuracy. Without being bound by theory, the increased overlay accuracy seen in some embodiments allows for smaller capture pads. In some embodiments, no capture pads are used (i.e., a via-in-line process).

Some embodiments of this disclosure advantageously provide for semiconductor chip sets with a reduced number of RDL layers. Without being bound by theory, the reduction in RDL layers lowers the fabrication cost of finalized semiconductor chip sets.

Figure 1:
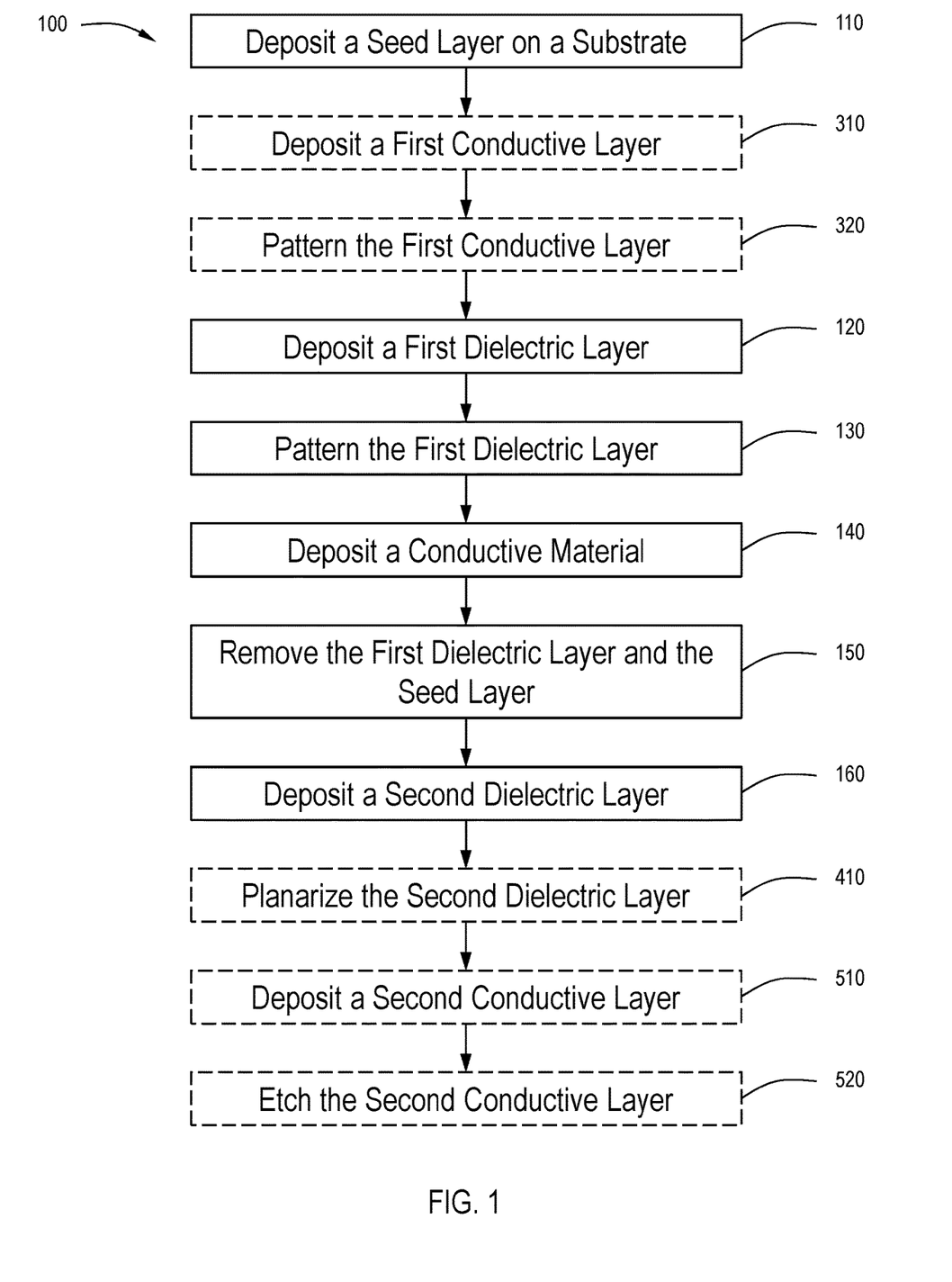
FIG. 1 illustrates an exemplary processing method according to one or more embodiment of the disclosure.
Figure 2:
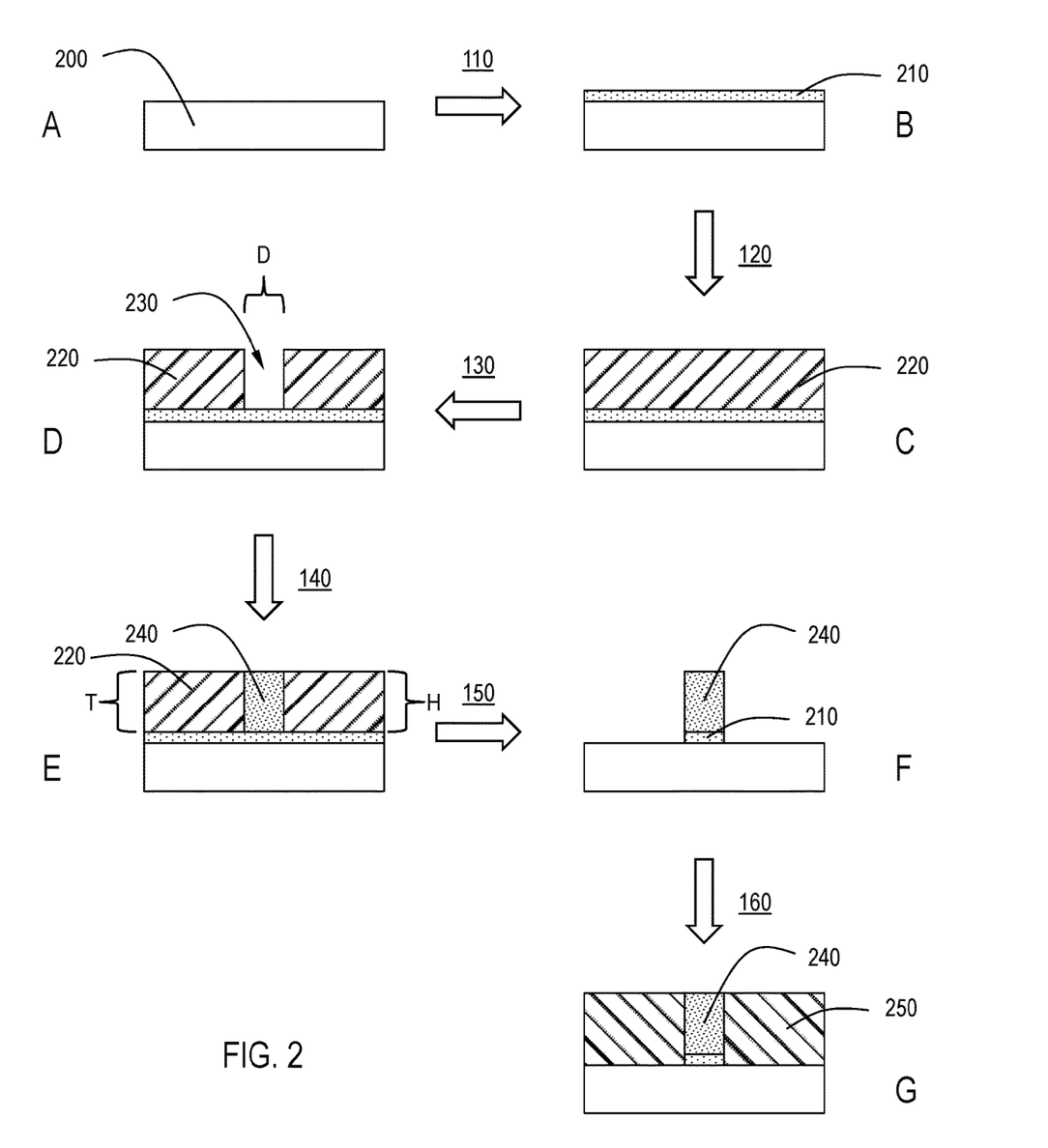
FIG. 2 illustrates an exemplary substrate during processing according to one or more embodiment of the disclosure.

Referring to FIGS. 1 and 2, an exemplary method 100 for forming microvias is illustrated as well as an exemplary substrate during processing. For the avoidance of doubt, the method shown in FIG. 1 contains several operations within dashed boxes. These operations are optional. Further, it is within the scope of this disclosure that some, all or none of the optional steps may be performed.

The method begins at operation 110 with the deposition of a conductive seed layer 210 on a substrate 200. In some embodiments, the substrate 200 is a silicon substrate. The substrate is shown in view 'A' of FIG. 2, and the substrate with the conductive seed layer is shown in view 'B' of FIG. 2. The lettered electronic devices in the Figures are used to denote the electronic device at various times during processing. Alternate electronic devices are formed by alternate or optional processes are denoted with prime marks (e.g., B'). As used in this regard, a "conductive" seed layer indicates a seed layer for a conductive material. The term "conductive" seed layer should not be understood to convey anything regarding the electrical properties of the "conductive" seed layer. In some embodiments, the conductive seed layer 210 comprises copper. In some embodiments, the conductive seed layer 210 is continuous. In some embodiments, the conductive seed layer 210 has an average thickness in a range of 50 nm to 500 nm. In some embodiments, not shown, a barrier layer is deposited on the substrate before depositing the conductive seed layer 210.

Figure 3:
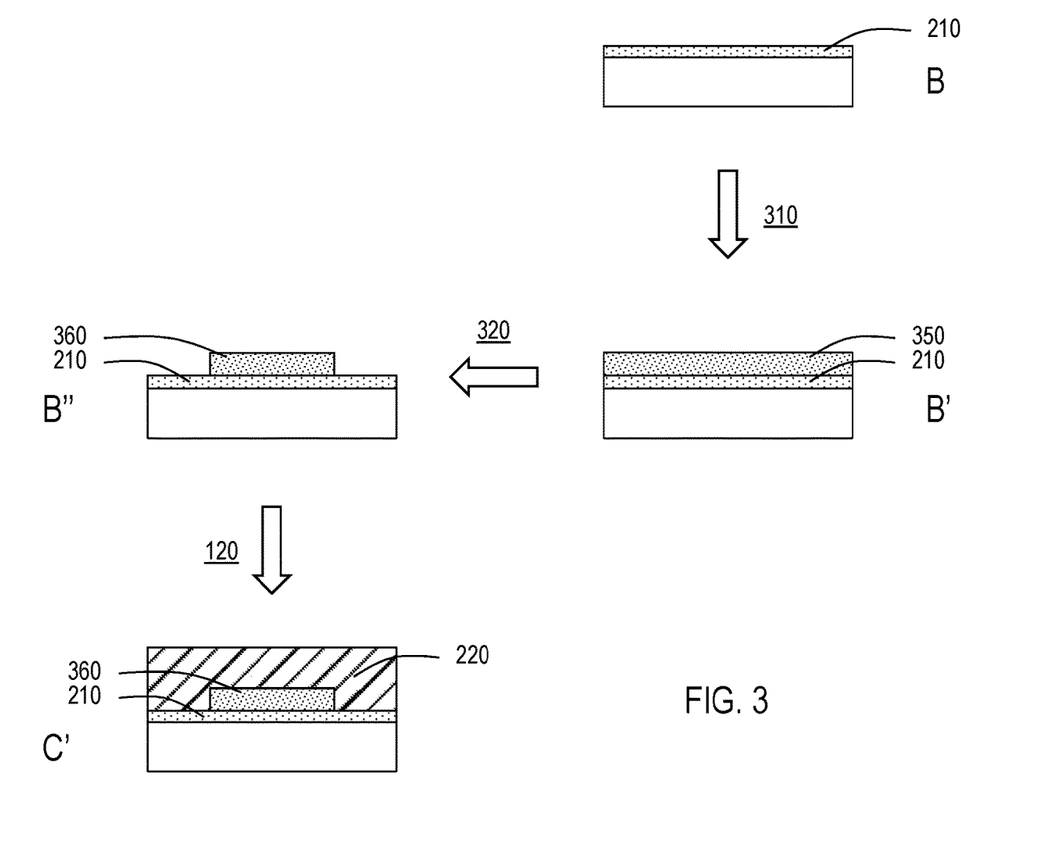
FIG. 3 illustrates an exemplary substrate during processing according to one or more embodiment of the disclosure.

In some embodiments, the method 100 continues with optional operation 310. For reference, a substrate 200 processed by optional operations 310 and 320 is shown in FIG. 3, and denoted as device B". The skilled artisan will recognize that the electronic devices of the same base letter can be substituted into any of methods described. For example, the device denoted B" can be substituted for the device denoted B in FIG. 2. At optional operation 310, a first conductive layer 350 is deposited on the conductive seed layer 210.

At operation 320, the first conductive layer 350 is patterned by removing portions of the first conductive layer 350 to form conductive features 360. In some embodiments, at operation 320, the first conductive layer 350 is patterned by removing portions of the first conductive layer 350 to form conductive features 360. Those skilled in the art will recognize this as a subtractive patterning process. Alternatively, in some embodiments, not shown, the first conductive layer 350 may be deposited by a patterned process and the conductive features 360 may be formed on the first conductive layer 350. Those skilled in the art will recognize this as a semi-additive process (SAP). In some embodiments, the conductive features 360 are conductive lines, traces or capture pads. In some embodiments, the first conductive layer 350 and the conductive features 360 comprise copper.

As used in this regard, a "capture pad" is a pad of conductive material where a via and/or pillar is expected to connect. Traditionally, the inaccuracy of laser drilling processes necessitated a larger capture pad so as to ensure that the via/pillar made contact with the conductive line. As mentioned above, some embodiments of the present disclosure provide microvias with increased overlay accuracy allowing for smaller capture pads or no capture pads. In some embodiments, the via is formed to be in contact with a conductive line without a capture pad.

In some embodiments, the via 230 is formed within a tolerance of a predetermined x-y location on the substrate 200. In some embodiments, the tolerance is less than or equal to 5 μm, less than or equal to 3 μm, less than or equal to 2 μm, less than or equal to 1 μm, less than or equal to 0.5 μm, or less than or equal to 0.25 μm from the predetermined x-y location. In some embodiments, the tolerance is less than or equal to 50%, less than or equal to 20%, less than or equal to 10%, less than or equal to 5% or less than or equal to 1% of the diameter D of the via from the predetermined x-y location.

The method 100 continues at operation 120 by depositing a first dielectric layer 220. The first dielectric layer 220 may be deposited by any suitable method, including but not limited to, atomic layer deposition (ALD), chemical vapor deposition (CVD), spin-on coating, hot-roll lamination, vacuum lamination, etc.

In some embodiments, the first dielectric layer 220 comprises a photosensitive dielectric material. In some embodiments, the first dielectric layer 220 comprises a negative tone photoresist or a positive tone photoresist. In some embodiments, the first dielectric layer 220 comprises a chemically amplified resist.

In some embodiments, not shown, a planarization layer is deposited before the first dielectric layer 220. Without being bound by theory, it is believed that the first dielectric layer may not self-level or planarize over features in the substrate (e.g., conductive features 360). Accordingly, in some embodiments, the planarization layer is deposited on the substrate, including any conductive features, to provide a level surface for deposition of the first dielectric layer 220. In some embodiments, the planarization layer comprises a dielectric layer. In some embodiments, the planarization layer comprises a parylene layer.

The method 100 continues at operation 130 by patterning the first dielectric layer 220 to form at least one via 230 having a diameter D. In those embodiments where the first dielectric layer 220 comprises a photosensitive dielectric material, the first dielectric layer 220 may be patterned by a photolithography process. In some embodiments, the operation 130 also removes any planarization layer exposed at the bottom of the via 230.

Unlike traditional laser drilling, in photolithography processes the diameter D of the via 230 is limited primarily by the resolution of the lithography process. As stated previously, the decreased diameter provided by some embodiments allows for higher wiring density in packaging applications.

In some embodiments, the diameter D of the via 230 is less than or equal to 20 µm, less than or equal to 15 µm, less than or equal to 10 µm, less than or equal to 8 µm, less than or equal to 5 µm, less than or equal to 3 µm, less than or equal to 1 µm or less than or equal to 0.5 µm. In some embodiments, the diameter D of the via 230 is in a range of 0.5 µm to 1 µm, in a range of 0.5 µm to 3 µm, in a range of 0.5 µm to 5 µm, in a range of 0.5 µm to 10 µm, in a range of 0.5 µm to 20 µm, in a range of 1 µm to 3 µm, in a range of 1 µm to 5 µm, in a range of 1 µm to 10 µm, in a range of 1 µm to 20 µm, in a range of 3 µm to 5 µm, in a range of 3 µm to 10 µm, or in a range of 3 µm to 20 µm.

The method 100 continues at operation 140 by depositing a conductive material 240 into the via 230 to form a pillar. In some embodiments, the conductive material comprises copper. In some embodiments, the height H of the pillar is less than or equal to the thickness T of the first dielectric layer 220. In some embodiments, the height H of the pillar is greater than the thickness of the first dielectric material. In these embodiments and overburden deposited outside of the via 230 may be removed. Any suitable removal process may be used including, but not limited to, planarization.

The method 100 continues at operation 150 by removing the first dielectric layer 220 and the seed layer 210. The removal process may be performed by any suitable process.

In some embodiments, the first dielectric layer 220 is removed by a wet etch process. In some embodiments, the wet etch process includes the use of an organic stripper. In some embodiments, the organic stripper comprises N-methylpyrolidone (NMP). In some embodiments, the wet etch process includes the use of an inorganic stripper. In some embodiments, the inorganic stripper may comprise a hydroxide and an amine. In some embodiments, the inorganic stripper comprises sodium or potassium hydroxide and tetramethyl ammonium hydroxide. In some embodiments, the wet etch process is performed at a temperature in a range of 20° C. to 50° C. In some embodiments, the wet etch process utilizes external forces including, but not limited to, ultrasonication or air agitation. Without being bound by theory, it is believed that the external forces of some embodiments improve mass flow and/or reaction speed so as to improve removal of the first dielectric layer 220.

In some embodiments, the seed layer 210 is removed by a wet etch process. In some embodiments, the wet etch process relies on a redox reaction of the seed layer 210. In some embodiments, the wet etch process includes the use of ferric chloride.

In some embodiments, the first dielectric layer 220 an/or the seed layer 210 are removed by a dry etch process. In some embodiments, the dry etch process includes the use of a plasma. In some embodiments, the plasma is formed from oxygen and argon. In some embodiments, the plasma is formed halogens and/or hydrogen gas.

In some embodiments, when a barrier layer is present, the barrier layer may also be removed by operation 150. In some embodiments, when a planarization layer is present, the planarization layer may also be removed by operation 150.

In some embodiments, the method 100 further comprises performing an ashing process. In some embodiments, the ashing process is performed after removal of the first dielectric layer 220 and the seed layer 210. In some embodiments, the ashing process removes any organic residues from the substrate 200. In some embodiments, the ashing process comprises exposing the substrate to a plasma generated from a mixture of $O_2$ and argon. In some embodiments, the plasma has a power in a range of 250 W to 300 W, or 280 W. In some embodiments, the substrate is exposed to the plasma for a period in a range of 2 minutes to 5 minutes.

In some embodiments, the plasma is provided with a bias power. In some embodiments, the bias power allows for a shorter reaction time. Without being bound by theory, it is believed that the bias power provides plasma species (ions, electrons, radicals, etc.) with directionality and helps add momentum to the plasma species. The increased impact energy is believed to increase reaction rates and increase the removal rate of residues of the dielectric layer.

The method 100 continues at operation 160 by depositing a second dielectric layer 250. In some embodiments, the second dielectric layer 250 comprises a redistribution layer (RDL) dielectric. In some embodiments, the RDL dielectric comprises a polymer dielectric. In some embodiments, the polymer dielectric comprises a filler. In some embodiments, the second dielectric layer 250 comprises a silica filled epoxy.

The second dielectric layer 250 may be formed by any suitable process. In some embodiments, the second dielectric layer 250 is deposited by dry film lamination. In some embodiments, the second dielectric layer 250 is initially flowable when deposited. In some embodiments, the second dielectric layer may be cured.

For example, in some embodiments, an silica filled epoxy is deposited by dry film lamination at a temperature in a range of 90° C. to 130° C. while under vacuum. Without being bound by theory, it is believed that at these temperatures, the epoxy in the dielectric becomes flowable, conforms around underlying features (e.g., lines/capture pads) and the lamination pressure ensures that the film is planarized on the top surface. Further, the vacuum ambient ensures that there are no air gaps between dielectric and substrate/lines/pads. In some embodiments, after lamination the second dielectric layer is cured at 180° C. for a period in a range of 30 minutes to 60 minutes. In some embodiments, the cure temperature is in a range of 150° C. to 200° C.

Figure 4:
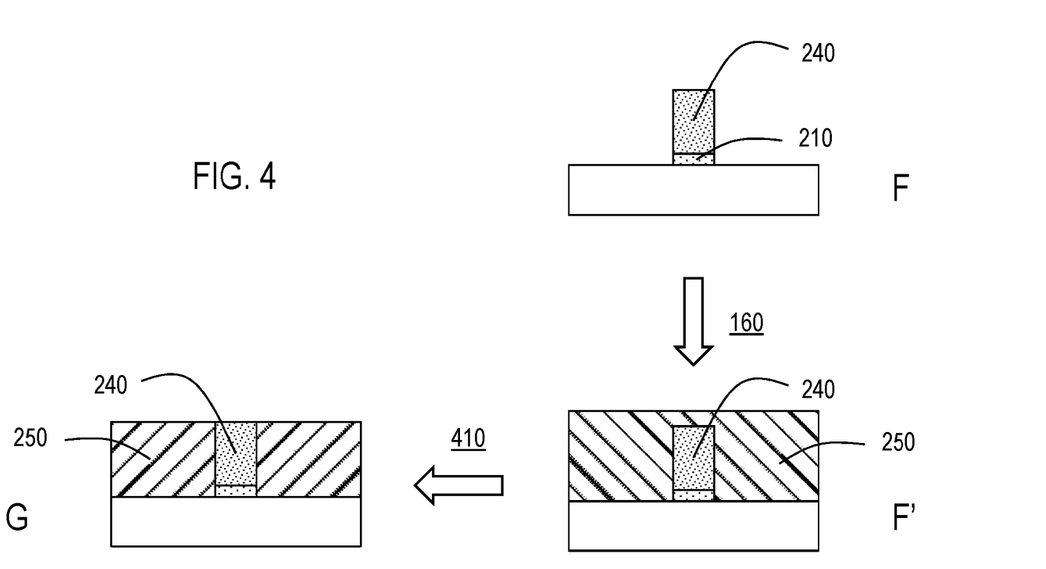
FIG. 4 illustrates an exemplary substrate during processing according to one or more embodiment of the disclosure.

In some embodiments, the method continues with optional operation 410. For reference, a substrate 200 processed by optional operation 410 is shown in FIG. 4. In some embodiments, the thickness of the second dielectric layer 250 is not tightly controlled during deposition at operation 160. In these embodiments the thickness of the second dielectric layer 250 may exceed the height H of the pillar of conductive material 240. At optional operation 410, the second dielectric layer 250 is planarized to expose the top of the conductive material 240. In some embodiments, the planarization process may be performed by CMP or an etch back process.

After optional operation 410, the top surface of the pillar and the second dielectric layer 250 are substantially coplanar. As used in this regard, material which are "substantially coplanar" have surfaces within +/−50 nm.

Figure 5:
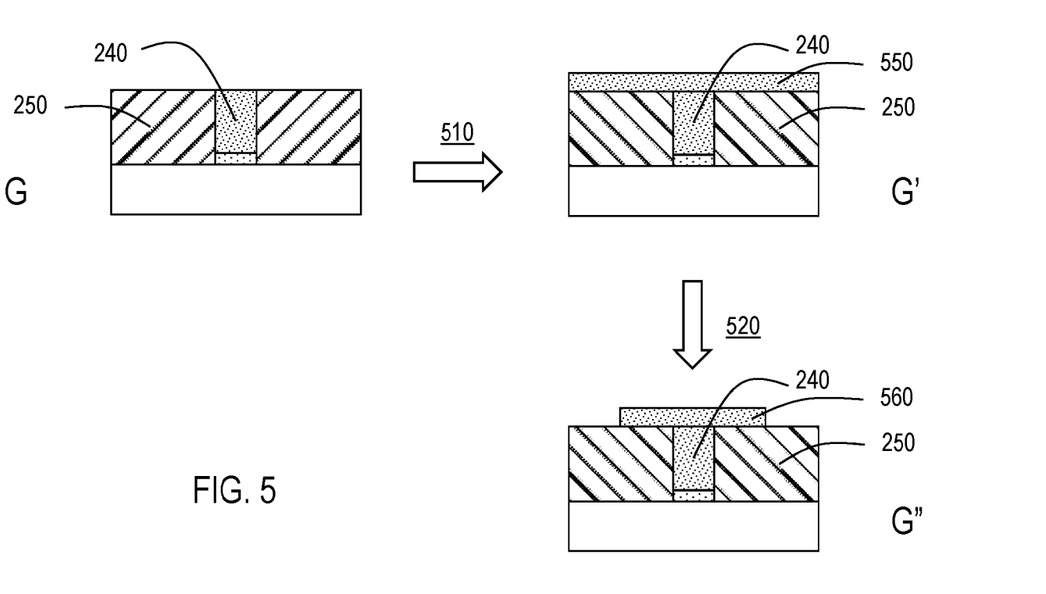
FIG. 5 illustrates an exemplary substrate during processing according to one or more embodiment of the disclosure.

In some embodiments, the method 100 continues at optional operations 510 and 520. For reference, a substrate 200 processed by optional operations 510 and 520 is shown in FIG. 5. At optional operation 510, a second conductive layer 550 is deposited on the second dielectric layer 250 and the conductive pillar. In some embodiments, at operation 520, the second conductive layer 550 is patterned by removing portions of the second conductive layer 550 to form conductive features 560. Those skilled in the art will recognize this as a subtractive patterning process. Alternatively, in some embodiments, not shown, the second conductive layer 550 may be deposited by a patterned process and the conductive features 560 may be formed on the second conductive layer 550. Those skilled in the art will recognize this as a semi-additive process (SAP). In some embodiments, the conductive features 560 are conductive lines, traces or capture pads. In some embodiments, the second conductive layer 550 and the conductive features 560 comprise copper.

Figure 6A:
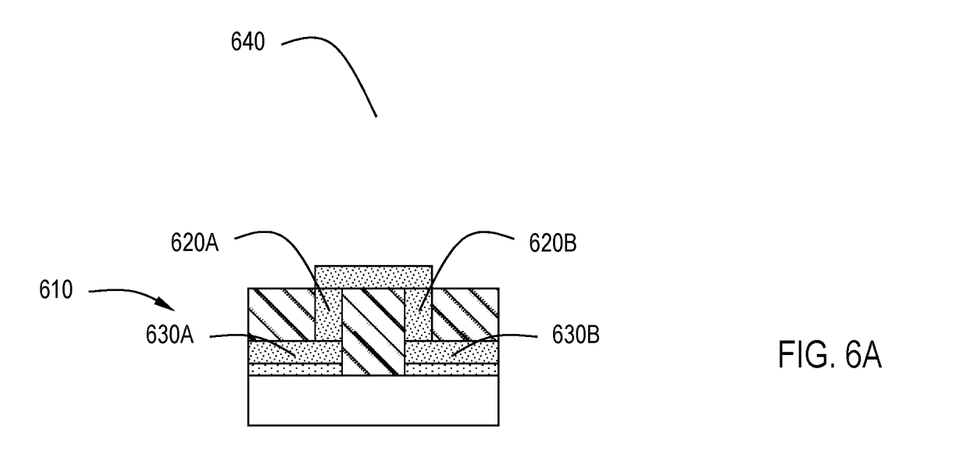
FIGS. 6A through 6C illustrates exemplary devices formed according to one or more embodiment of the disclosure.
Figure 6B:
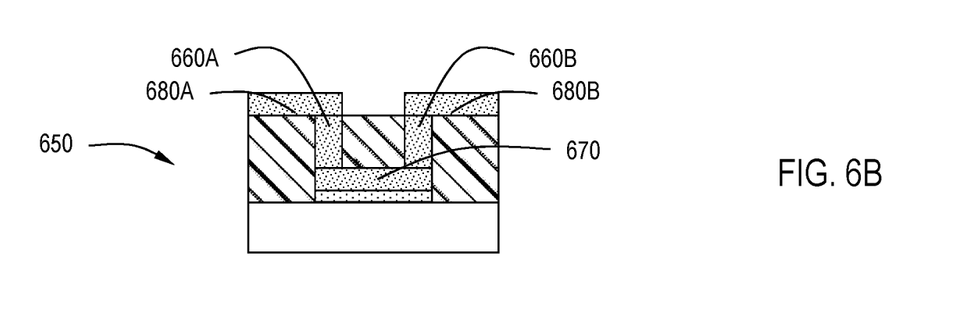
Figure 6C:
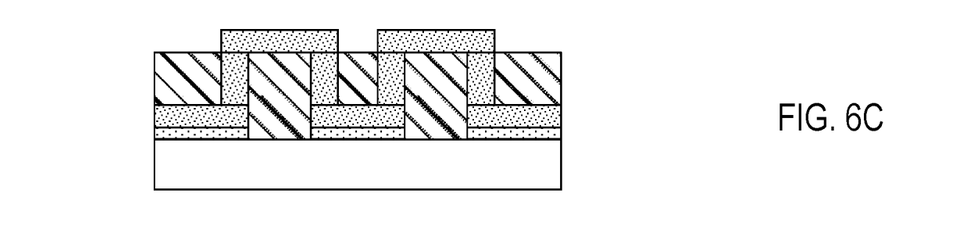

Referring to FIGS. 6A-6C, related embodiments of a finished device are illustrated. In FIG. 6A, the device 610 comprises at least two pillars 620A, 620B which connect two first copper lines 630A, 630B to a single second copper line 640. Alternatively, in FIG. 6B, the device 650 comprises at least two pillars 660A, 660B which connect a single first copper line 670 to two second copper lines 680A, 680B. Finally, in FIG. 6C, the embodiments of FIG. 6A and FIG. 6B are combined to connect a plurality of first copper lines with a plurality of second copper lines in a "daisy-chain" fashion.

Figure 7:
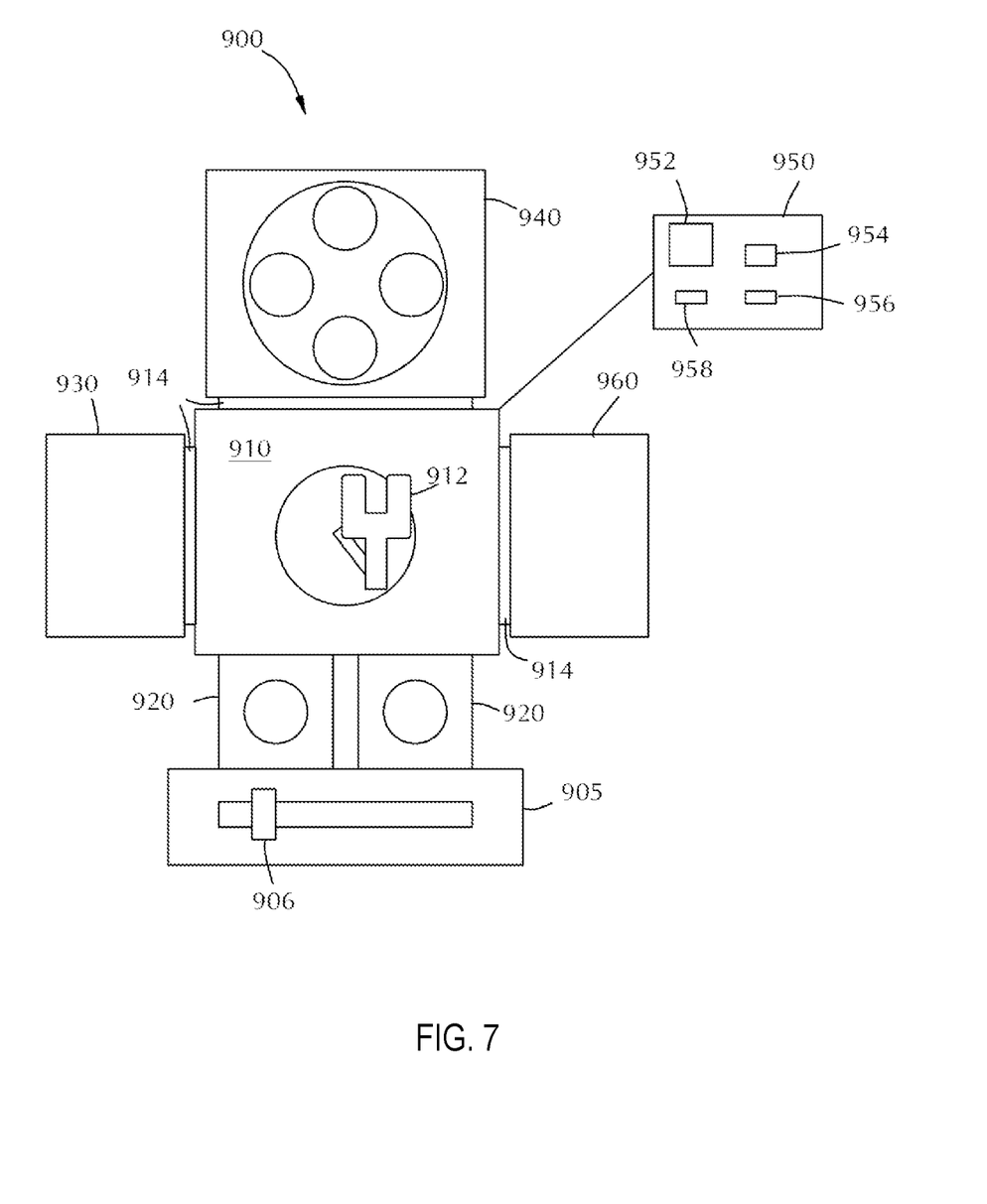
FIG. 7 illustrates a processing system according to one or more embodiment of the disclosure.

With reference to FIG. 7, additional embodiments of the disclosure are directed to a processing system 900 for executing the methods described herein. FIG. 7 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 7, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a patterning chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

In some embodiments, processing chamber 960 is connected to the central transfer station 910 and is configured to act as an etching or removal chamber. The processing chamber 960 can be configured to perform one or more different epitaxial growth processes.

In some embodiments, each of the processing chambers 930, 940 and 960 are configured to perform different portions of the processing method. For example, processing chamber 930 may be configured to perform the deposition processes, processing chamber 940 may be configured to perform the patterning processes and processing chamber 960 may be configured to perform the etch/removal processes. The skilled artisan will recognize that the number and arrangement of individual processing chamber on the tool can be varied and that the embodiment illustrated in FIG. 7 is merely representative of one possible configuration.

In some embodiments, the processing system 900 includes one or more metrology stations. For example metrology stations can be located within pre-clean/buffer chamber 920, within the central transfer station 910 or within any of the individual processing chambers 930, 940, 960. The metrology station can be any position within the system 900 that allows the substrate to be measured without removing the substrate from the system 900.

At least one controller 950 is coupled to one or more of the central transfer station 910, the pre-clean/buffer chamber 920, processing chambers 930, 940, or 960. In some embodiments, there is more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a conductive seed layer on the substrate; a configuration to deposit a first copper layer; a configuration to pattern the first copper layer; a configuration to deposit a first dielectric layer; a configuration to pattern the first dielectric layer; a configuration to deposit a conductive material into a via; a configuration to remove the first dielectric layer; a configuration to deposit a second dielectric layer; a configuration to planarize the second dielectric layer; a configuration to deposit a second copper layer; and/or a configuration to pattern the second copper layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a microvia, the method comprising:
    depositing a conductive seed layer on a substrate;
    depositing a first conductive layer on the conductive seed layer;
    patterning the first conductive layer to form first conductive lines or capture pads;
    depositing a first dielectric layer;
    patterning the first dielectric layer to form at least one via having a diameter;
    depositing a conductive material into the at least one via to form at least one conductive pillar with a height;
    removing the first dielectric layer and the conductive seed layer from the substrate; and
    depositing a second dielectric layer around the at least one conductive pillar.

2. The method of claim 1, further comprising performing an ashing process after removing the first dielectric layer and the conductive seed layer.

3. The method of claim 1, further comprising:
    depositing the second dielectric layer with a thickness greater than the height of the at least one conductive pillar; and
    planarizing the second dielectric layer to expose a top of the at least one conductive pillar.

4. The method of claim 1, further comprising:
    depositing a second conductive layer on the second dielectric layer and the at least one conductive pillar; and
    patterning the second conductive layer to form second conductive lines or capture pads.

5. The method of claim 1, wherein the conductive seed layer and the conductive material comprise copper.

6. The method of claim 1, wherein the first dielectric layer comprises a photosensitive dielectric and patterning at least one via into the first dielectric layer comprises a photolithography process.

7. The method of claim 6, wherein the photosensitive dielectric comprises a positive tone photoresist.

8. The method of claim 6, wherein the photosensitive dielectric comprises a negative tone photoresist.

9. The method of claim 1, wherein the second dielectric layer comprises an RDL polymer dielectric.

10. The method of claim 9, wherein the RDL polymer dielectric comprises a silica filled epoxy.

11. The method of claim 1, wherein the diameter of the at least one via is less than or equal to 20 µm.

12. The method of claim 11, wherein the diameter of the at least one via is in a range of 1 µm to 20 µm.

13. The method of claim 1, wherein the at least one via is formed within a tolerance of a predetermined x-y location, the tolerance being less than or equal to 0.5 µm from the predetermined x-y location.

14. The method of claim 1, wherein the at least one via is formed to be in contact with a conductive line without a capture pad.

15. A method of forming a microvia, the method comprising:
depositing a copper seed layer on a substrate;
depositing a first copper layer on the copper seed layer;
patterning the first copper layer to form a first copper line;
depositing a first dielectric layer on the first copper line, the first dielectric layer being photosensitive;
patterning the first dielectric layer to form a via having a diameter, the via positioned over the first copper line;
depositing a copper material into the via to form a copper pillar;
removing the first dielectric layer and the copper seed layer from the substrate;
depositing a second dielectric layer around and over the copper pillar, the second dielectric layer comprising silica filled epoxy;
planarizing the second dielectric layer to expose a top of the copper pillar;
depositing a second copper layer on the second dielectric layer and the copper pillar; and
patterning the second copper layer to form a second copper line.

16. The method of claim 15, wherein the diameter of the via is greater than or equal to 1 µm and less than or equal to 20 µm.

17. The method of claim 15, wherein the via is formed within a tolerance of a predetermined x-y location, the tolerance being less than or equal to 0.5 µm from the predetermined x-y location.

18. The method of claim 15, wherein at least two copper pillars are formed to connect two first copper lines to a single second copper line or vice versa.

19. A non-transitory computer readable medium including instructions, that, when executed by a controller of a processing system, cause the processing system to perform operations of:
depositing a copper seed layer on a substrate;
depositing a first conductive layer on the copper seed layer;
patterning the first conductive layer to form first conductive lines or capture pads;
depositing a first dielectric layer;
patterning the first dielectric layer to form a via having a diameter;
depositing a copper material into the via to form a copper pillar;
etching the first dielectric layer and the copper seed layer from the substrate; and
depositing a second dielectric layer around the copper pillar.

* * * * *